(12) United States Patent
Renno et al.

(10) Patent No.: US 8,536,879 B2
(45) Date of Patent: Sep. 17, 2013

(54) ROTATING ELECTRIC-FIELD SENSOR

(75) Inventors: Nilton O. Renno, Ann Arbor, MI (US);
Steven A. Rogacki, Chelsea, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 519 days.

(21) Appl. No.: 12/992,510

(22) PCT Filed: Jun. 2, 2009

(86) PCT No.: PCT/US2009/003349
§ 371 (c)(1),
(2), (4) Date: Nov. 19, 2010

(87) PCT Pub. No.: WO2009/148572
PCT Pub. Date: Dec. 10, 2009

(65) Prior Publication Data
US 2011/0062968 A1    Mar. 17, 2011

Related U.S. Application Data

(60) Provisional application No. 61/058,022, filed on Jun. 2, 2008.

(51) Int. Cl.
*G01R 29/12* (2006.01)
*G01R 27/26* (2006.01)

(52) U.S. Cl.
CPC ............ *G01R 29/12* (2013.01); *G01R 27/2611* (2013.01)
USPC .......................................... 324/654; 324/458

(58) Field of Classification Search
None
See application file for complete search history.

(56) References Cited

U.S. PATENT DOCUMENTS

| 2,820,947 A | 1/1958 | Gunn |
| 3,273,066 A | 9/1966 | Ruhnke |

(Continued)

FOREIGN PATENT DOCUMENTS

JP    2004-354057 A    12/2004

OTHER PUBLICATIONS

Cooperman, "A New Technique for the Measurement of Corona Field Strength and Current Density in Electrical Precipitation", Transactions of the American Institute of Electrical Engineers, Mar. 1956, pp. 64-67, vol. 75.

(Continued)

*Primary Examiner* — Paresh Patel
(74) *Attorney, Agent, or Firm* — Howard & Howard Attorneys PLLC

(57) ABSTRACT

A compact instrument package consisting of a rotating sensor and supporting signal-processing electronics is capable of measuring two-dimensional electric-field vectors, ranging from DC to an arbitrary upper AC frequency not limited by the rotation rate, with highly improved accuracy and sensitivity when compared with previous art. In addition, contrary to previous art, the sensor can measure the electric field gradient at its location. This is achieved by the use of a combination of quadrature modulation and phase-sensitive quadrature demodulation digital signal processing in a generic rotating electric-field sensor. Ground isolated versions of the instrument can be used singly or in arrays when precise measurements of the electric fields are necessary. Either grounded or isolated versions of the instrument can operate continuously without the need for internal batteries, making it extremely attractive for a wide-range of industrial and space applications. Operational modes have been developed to distinguish the effects of ion currents and charged particles impacting the sensor from the local ambient electric field. Moreover, particular versions of the instrument can be operated in corrosive environments and conducting fluids.

23 Claims, 3 Drawing Sheets

(56) References Cited

U.S. PATENT DOCUMENTS

| | | | |
|---|---|---|---|
| 3,458,805 A | | 7/1969 | Kasemir |
| 3,662,260 A | | 5/1972 | Thomas et al. |
| 3,812,419 A | | 5/1974 | Kaunzinger et al. |
| 3,820,095 A | | 6/1974 | Wojtasinski et al. |
| 3,846,700 A | | 11/1974 | Sasaki et al. |
| 3,878,459 A | | 4/1975 | Hanna |
| 3,917,996 A | | 11/1975 | Wagner et al. |
| 3,925,726 A | | 12/1975 | Few |
| 4,055,798 A | | 10/1977 | Kato |
| 4,101,825 A | | 7/1978 | Truax |
| 4,222,007 A | | 9/1980 | Comstock |
| 4,261,660 A | * | 4/1981 | Suzuki et al. .................. 399/48 |
| 4,424,481 A | | 1/1984 | Laroche et al. |
| 4,529,940 A | | 7/1985 | Blitshteyn |
| 4,569,583 A | * | 2/1986 | Robson et al. .................. 399/73 |
| 4,642,559 A | | 2/1987 | Slough |
| 4,950,978 A | | 8/1990 | Govaert |
| 5,315,232 A | | 5/1994 | Stewart |
| 5,315,254 A | | 5/1994 | Wang et al. |
| 5,886,528 A | | 3/1999 | Perry |
| 6,150,945 A | | 11/2000 | Wilson |
| 6,600,323 B2 | | 7/2003 | Kieres et al. |
| 6,608,483 B1 | | 8/2003 | Hill |

OTHER PUBLICATIONS

International Search Report and Written Opinion dated Jan. 29, 2010.
Anderson, "Absolute Measurements of Atmospheric Charge Density", Journal of Geophysical Research, Dec. 15, 1966, pp. 5809-5814, vol. 71, No. 24.
Comber, et al., "Experimental Evaluation of Instruments for Measuring DC Transmission Line Electric Fields and Ion Currents", IEEE Transactions on Power Apparatus and Systems, Nov. 1983, pp. 3549-3557, vol. PAS-102, No. 11.
Harnwell, et al., "An Electrostatic Generating Voltmeter", R.S.I., Oct. 1933, pp. 540-541, vol. 4.
"IEEE Standard Procedures for Measurement of Power Frequency Electric and Magnetic Fields from AC Power Lines", Published by The Institute of Electrical and Electronics Engineers, Inc., Mar. 16, 1987, pp. 1-24, ANSI/IEEE Std 644-1987, New York, New York.
Johnston, et al., "A Miniaturized Space-Potential DC Electric Field Meter", IEEE Transactions on Power Delivery, Apr. 1989, pp. 1253-1261, vol. 4, No. 2.
Johnston, et al., "dc electric field meter with fiber-optic readout", The Review of Scientific Instruments, Nov. 1986, pp. 2746-2753, vol. 57, No. 11.
Kirkham, et al., "Magnetic and Electric Field Meters Developed for the U.S. Department of Energy", Jet Propulsion Laboratory, DOT/ET-29372-8, Jan. 1988.
Kirkham, et al., "AC and DC Electric Field Meters Developed for the U.S. Department of Energy", Jet Propulsion Laboratory, Department of Energy, Report No. DOE/ET29372-7, Feb. 1987. (Part 1 of 2).
Kirkham, et al., "AC and DC Electric Field Meters Developed for the U.S. Department of Energy", Jet Propulsion Laboratory. Department of Energy, Report No. DOE/ET29372-7, Feb. 1987. (Part 2 of 2).
Kirkpatrick, et al., "A Generating Voltmeter for the Measurement of High Potentials", The Review of Scientific Instruments, Jan. 1932, pp. 1-8, vol. 3, No. 1.
Maruvada, et al., "Development of Field-Mill Instruments for Ground-Level and Above-Ground Electric Field Measurement Under HVDC Transmission Lines", IEEE Transactions on Power Apparatus and Systems, Mar. 1983, pp. 738-744, vol. PAS-102, No. 3.
Secker, et al., "Instrumentation for Electrostatic Measurements", Journal of Electrostatics, 1984, pp. 1-19, vol. 16, Elsevier Science Publishers B.V.
Smiddy, et al., "The double field-mill", Journal of Atmospheric and Terrestrial Physics, 1958, pp. 206-210, vol. 12, Pergamon Press Ltd., London.
Tassicker, et al., "Boundary probe for measurement of current density and electric-field strength—with special reference to ionised gases", Proceedings of the IEEE, Mar. 1974, pp. 213-220, vol. 121, No. 3.
Hidaka et al., "A new method of electric field measurements in corona discharge using Pockels device", Journal of Applied Physics, pp. 5999-6003, Sep. 1982, vol. 53, No. 9.

* cited by examiner

ROTATING ELECTRIC-FIELD SENSOR

RELATED APPLICATIONS

The present application claims priority to U.S. Provisional Patent Application Ser. No. 61/058,022, filed Jun. 2, 2008, which is incorporated by reference in its entirety.

GOVERNMENT LICENSE RIGHTS

This invention was made with government support under ATM0402738 awarded by the National Science Foundation. The government has certain rights in the invention.

FIELD OF THE INVENTION

The present invention is related generally to electric-field sensors, and more particularly, to a rotating electric-field sensor using quadrature modulation and phase-sensitive demodulation.

BACKGROUND OF THE INVENTION

Definitions:

Field mill: A device in which a conductor is alternately exposed to the electric-field to be measured and then shielded from it. Syn: Generating voltmeter, generating electric-field meter.

Vibrating plate electric-field meter: A device in which a sensing plate is modulated below the aperture of a faceplate in the electric-field to be measured. Syn: Vibrating probe.

Measurements of DC Electric-Fields

Three types of DC electric-field sensors have been used in science and engineering: shutter-type, vibrating plate, and cylindrical field mills. These devices determine the electric-field by measuring modulated, capacitively induced charges or currents sensed by conducting electrodes. Other instrumentation capable of measuring DC electric-fields exists (for example, radiation probes), but they are very specialized and do not find a wide-range of applications.

The shutter-type electric-field mill is the instrument mostly widely discussed in the literature (See FIG. 1). Indeed, many versions of this instrument are covered by patents. Harnwell and Van Voorhis (1933) were the first to propose this type of sensor. Field mills have a sensing electrode that is periodically exposed and shielded from the electric-field by a grounded rotating shutter. Shutter-type field mills are grounded and distort the electric-fields in their vicinity. The charge $q_s$ induced by ambient electric fields in its sensing electrode at any time instant t, as well as the induced current $i_s$, between the ground and the electrode is alternately exposed and shielded as it moves. The charge and the current are proportional to the amplitude of the component of the local electric-field (E) perpendicular to the shutter surface. The signal of the charge, and therefore the direction of the current, depends on the polarity of the field. Shutter type field mills distort the electric-field and are not capable of measuring the electric-field vector or the field gradient. Thus, they must be calibrated in the same situation (geometry, surrounding materials, charge distribution, etc) that will be encountered during measurements. Thus, the calibration procedure can be complex and vary with time in the dynamical situations frequently encountered in industrial processes.

Shutter-type field mills usually measure the magnitude of the electric-field by measuring the current between the ground and the sensing electrode:

$$i_s(t) = \frac{dq_s(t)}{dt} = \varepsilon_0 E \frac{da(t)}{dt}, \quad (1)$$

where $\varepsilon_0$ is the permittivity of free space, $q_s(t)$ and $a(t)$ are the induced charge and exposed area of the sensing element at time t (FIG. 1). This type of mill has a frequency response less than ½ the commutation rate, which is the rotation rate times the number of vanes. A typical frequency response is DC to 10 Hz or less. The shape of a(t) is generally triangular but this is not critical because the current $i_s(t)$ is sampled once per commutation at its peak value.

A specific type of quadrature modulation has been applied to the shutter-type field mill, U.S. Pat. No. 6,608,483, which improves the range of the frequency response. In this case, the shape of a(t) is important because of the type of signal processing used, with the triangular waveform being the ideal. The treatment of DC fields is straightforward, and the commutation rate no longer limits the upper frequency response. However, the triangular waveform produces errors in the transient response. The errors depend on the timing of transient with respect to the shutter angular position. These time domain errors also produce errors in the frequency response. In addition, these shutter type field mills are subject to noise caused by the sliding brush contact with the rotating grounded shutter.

DC electric fields can also be measured with vibrating plate sensors (Comber et al., 1983). However, this type of sensor is not widely used because it is less sensitive than field mills. Like the shutter-type field mills, vibrating plate field meters are grounded and distort the electric field in their vicinity. Moreover, they only measure the amplitude of the component of the electric field perpendicular to its sensing plate. Therefore, vibrating plate field meters also require complex calibrations and are not suitable for typical industrial applications.

A less common type of field mill described in the literature is the cylindrical field mill (See FIG. 2). Kirkpatrick and Miyake (1932) were the first to discuss this type of sensor. Grounded cylindrical fields mills have been developed further by Maruvada et al. (1983), while a new class of isolated cylindrical field mills was developed by Kirkham et al. (1987) and Johnston and Kirkham (1989). Except for small effects due to the charging of the sensor and its image on nearby objects, isolated field mills do not distort the electric-field in their vicinity. Usually, cylindrical field mills measure the electric field by measuring the amplitude and phase of the current $i_c(t)$ flowing between two half-cylinder electrodes rotating with constant angular velocity $\omega$, and connected to each other by a low-impedance measuring circuit (FIG. 2). Thus, in cylindrical field mills:

$$i_c(t) = 4\varepsilon_0 rLE\omega \sin(\omega t + \phi), \quad (2)$$

where r is the radius and L the length of each electrode, and $\phi$ is the phase of the two-dimensional electric field perpendicular to the axis of rotation with respect to a reference.

Cylindrical field mills also measure ion currents along the space field lines terminating on them. This poses a problem for grounded field mills because they cannot distinguish the currents due to the ion fluxes from that due to the local electric field. However, this effect can be removed by the use of two cylinders rotating at different angular velocities $\omega$. This is not a problem in isolated field mills because their electrodes are quickly charged in the presence of ion currents and prevents further ion flow into the electrodes. With two orthogonally mounted sensors, it is possible to measure the 3-dimensional electric field, and a single sensor can measure the 2-dimensional field perpendicular to its axis of rotation.

In the prior art, cylindrical field mills have a pair of isolated conducting surfaces connected by a current measuring circuit as shown in FIG. 2. There are significant differences between this device and the shutter type field mill. The cylindrical mill has no grounded shutter, and in fact can be operated either grounded or isolated from ground. Both devices have rotating components that produce a measurable AC signal based on the DC external or ambient electric field. Rather than a sensing surface that is alternately shielded and unshielded by grounded elements however, the cylindrical field mill contains a fixed volume enclosed by a conductive surface. A fixed volume covered by a conducting surface shorts the external or ambient electric field, and therefore experiences a redistribution of surface charge that cancels any internal electric field. The charge distribution is proportional to the ambient electric field. The current flow produced by the charge redistribution as the cylinder rotates can be measured as it passes through a low impedance measuring circuit, referred to as an inverting type circuit. The cylindrical field mill can also measure field vectors in two dimensions while the shutter type field mill cannot. Finally, an important difference between cylindrical field mills and shutter sensors is that the current induced by uniform ambient fields is sinusoidal on cylindrical field mills, but it is roughly triangular in the prior art of the shutter type mills. Thus, the quadrature measurement technique described below can accurately reproduce the characteristics of the electric field over the frequency range of interest in our cylindrical field mill device, but not in the shutter type field mills discussed previously. Indeed, the triangular form of quadrature modulation used in the prior art introduces errors in the measurements. This significant difference provides a distinct improvement in the current design over the prior art.

The present invention is aimed at one or more of the problems identified above.

SUMMARY OF THE INVENTION

In a first aspect of the present invention, an electric field sensor or instrument, and a method for measuring DC and AC fields is provided. The instrument includes a rotating sensor element, a motor assembly, sensing circuit, and a processor. The rotating sensor element is composed of four quadrature sections that rotate around a fixed axis. The motor assembly spins the sensor element at a controllable rotation rate. The sensing circuit is coupled to the quadrature sections for measuring the currents induced within each quadrature section by the external electric-field and responsively generating respective current signals. The processor is coupled to the motor assembly and to the sensing circuit for controlling the rotation rate of the sensor element, receiving the respective current signals, and recovering waveforms representative of the external electric fields.

The quadrature signals may then be demodulated by, for example, multiplying the signals with a sinusoidal function with the modulation frequency. Then the resulting products are combined in a way that cancels the effect of signal aliasing and reproduce the original electric field either (a) by utilizing a Fast Fourier Transform or (b) by multiplying the products by a sinusoidal function.

In a second aspect of the present invention, a method of operation of the electric field sensor or instrument is provided. The method includes the steps of rotating the sensor element at a controllable rate, measuring the current induced within each quadrature section by the electric-field and responsively generating first, second, third and fourth current signals, respectively, and receiving the respective current signals at the processor and recovering a waveform representative of the electric field.

In a third aspect of the present invention, an instrument for measuring electric-field vectors is provided. The instrument includes a rotating sensor element, a motor assembly, a sensing circuit and a processor. The rotating sensor element has a generally cylindrical shape and is composed of four quadrature sections that rotate about an axis. The motor assembly is coupled to the rotating sensor element for supporting and rotating the rotating sensor element about the axis at a controllable rotation rate. The sensing circuit includes four amplifiers. Each amplifier is electrically coupled to a respective one of the quadrature section for measuring the current induced within the quadrature section by the electric-field and responsively generating respective current signals. The processor is coupled to the motor assembly for controlling the rotation rate of the sensor element and for receiving the respective current signals, for combining the first, second, third and fourth current signals and responsively generating first and second quadrature signals and recovering a waveform representative of the electric field by demodulating the first and second quadrature signals.

In a fourth aspect of the present invention, an implementation of the rotating sensing element and the processor are provided. The rotating sensor element is composed of four quadrature sections. The sensor element rotates about a fixed axis. The operating method includes the steps of rotating the sensor element at controllable rotation rates, measuring the current induced within each quadrature section by the electric-field and for generating first, second, third and fourth current signals, respectively; and receiving the respective current signals at the processor and recovering waveforms representative of the external electric fields.

In a fifth aspect of the present invention, an implementation of the circuit for measuring electric fields is provided. The sensor includes a rotating sensor element, a motor assembly, a current sensing circuit and a processor. The current sensing circuit has four amplifiers. Each amplifier is electrically coupled to others of the quadrature sections for measuring the current induced within the quadrature sections by the external electric-field and generating respective current signals. The processor is coupled to the motor assembly for controlling the rotation of the sensor element and to the sensing circuit for receiving the respective current signals, for combining the first, second, third and fourth current signals and responsively generating first and second quadrature signals, and for recovering waveforms representative of the electric fields by demodulating the first and second quadrature signals.

BRIEF DESCRIPTION OF THE DRAWINGS

Other advantages of the present invention will be readily appreciated as the same becomes better understood by reference to the following detailed description when considered in connection with the accompanying drawings wherein.

DETAILED DESCRIPTION OF INVENTION

Figure 1:
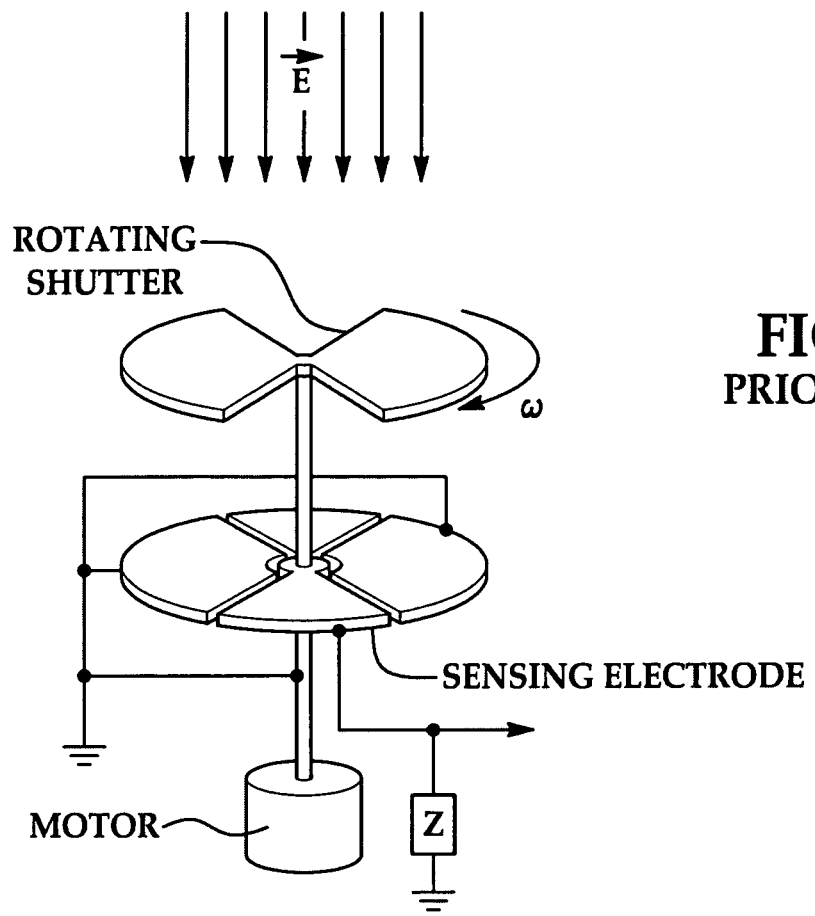
FIG. 1 is a sketch of a shutter type field mill sensor.

Referring to the FIGS. 3A, 3B, 4 and 5, a rotating electric-field sensor or instrument 10 is provided. The present invention is capable of measuring vector electric-fields ranging from DC to an arbitrary upper frequency not limited by the rotation rate with higher accuracy and sensitivity than prior methods. This is accomplished by the use of a combination of quadrature modulation and phase sensitive quadrature demodulation, implemented in a processor or digital signal processor 12. Contrary to previous sensors, the electric-field sensor 10 of the present invention can operate continuously without the need for brushes or internal batteries, in either grounded or isolated versions, making it suitable to industrial applications. In addition, an electric-field sensor 10 comprised of a single rotating electrode operating sequentially at two different rotation rates can be used to distinguish the effects of the ambient space field from that due to the collision of charged particles or ion currents with the sensor (see below). This makes measurements of the electric field in the presence of charged powders and droplets possible.

With specific reference to FIGS. 3A, 3B, 4 and 5, one embodiment of a sensor 10 for measuring an electric-field of the present invention is illustrated. The sensor 10 includes a rotating sensor element 14, a motor assembly 16, a sensing circuit 18 and the processor 12. The rotating sensor element 14 has a generally cylindrical shape and is composed of four quadrature sections 14A, 14B, 14C, 14D. In the illustrated embodiment, each quadrature section 14A, 14B, 14C, 14D has a first end and a second end. The first ends of each quadrature section 14A, 14B, 14C, 14D are aligned and the second ends of each quadrature section 14A, 14B, 14C, 14D are aligned. The sensor element 14 is forced to rotate about an axis 20 by the motor assembly 16. Alternatively, other sensor geometries could be used. For example, the rotating sensor element could be composed of two cylinders, each having two half cylindrical sections which rotate on the same axis, but are 90 degrees out of phase.

The motor assembly 16 is coupled to the rotating sensor element 14 for supporting and rotating the sensor element 14 about the axis 20 at a controllable rotation rate. As shown, the motor assembly 16 includes motor 22 which is coupled, and under the control of, the processor 12, via a driver circuit 26. A position reference sensor 24 provides feedback to the processor of the rotational position of the sensor element 14.

The sensing circuit 18 is coupled to the quadrature sections 14A, 14B, 14C, 14D for measuring the current induced within each quadrature section by the electric-field and responsively generates respective current signals.

The processor 12 is coupled to the motor assembly 16 for controlling the rotation of the sensor element and the sensing circuit 18 for receiving the respective current signals and recovering the waveform representing the electric field (see below).

In the illustrated embodiment, the current sensing circuit 18, includes four amplifiers 28A, 28B, 28C, 28D. Each amplifier 28A, 28B, 28C, 28D is electrically coupled to one of the quadrature sections 14A, 14B, 14C, 14D for producing respective first, second, third and fourth current signals in response to the measured current in the respective quadrature section 14A, 14B, 14C, 14D.

In one aspect, the processor 12 combines the first, second, third, and fourth current signals and produces first and second quadrature signals. The processor 12 then demodulates the first and second quadrature signals to recover the waveform representing the electric field. For example, in demodulating the first and second quadrature signals, the processor 12 may multiply the first and second quadrature signals by a sinusoidal function having a modulation frequency, e.g., the rotational frequency of the sensor element 14.

Figure 3A:
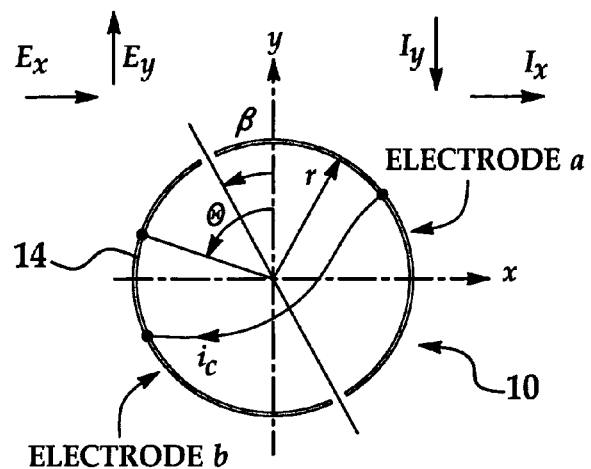
FIG. 3A is a sketch of the cross section of a field mill in a two-dimensional electric field (E) and a two-dimensional flow of charged particles (I)
Figure 3B:
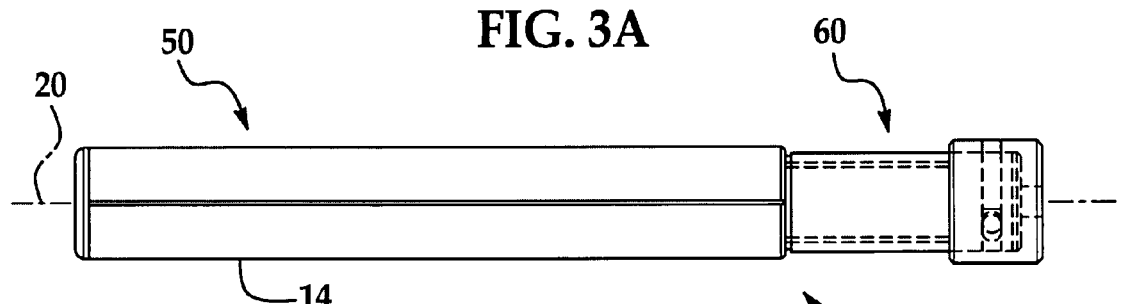
FIG. 3B is a sketch of the sensor assembly, according to an embodiment of the present invention without the quadrature modulation.
Figure 5:
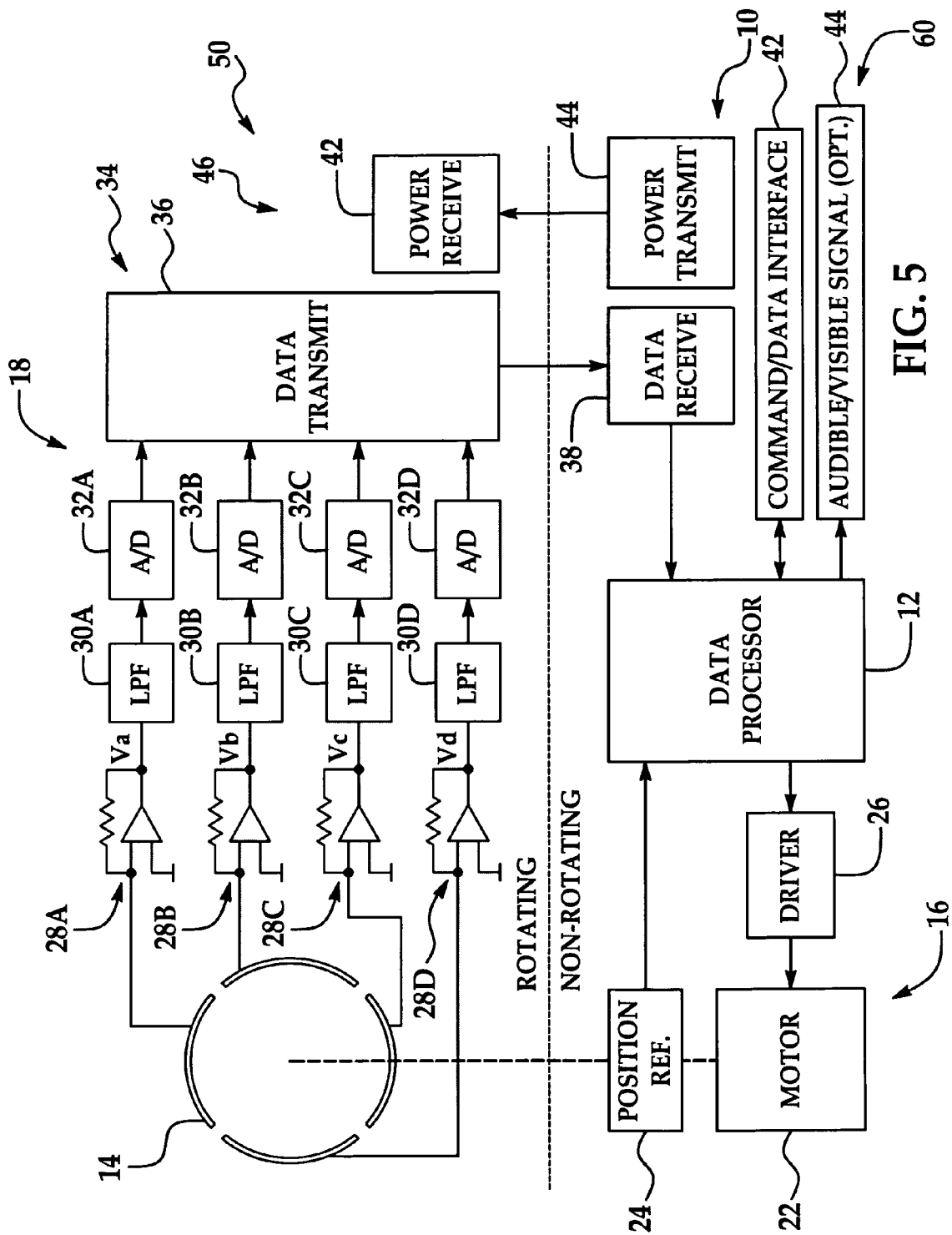

With particular reference to FIGS. 3B and 5, the sensor 10 includes a rotating portion 59 and a non-rotating portion 60. In the illustrated embodiment, the rotating section 50 includes the sensor element 14 and the sensing circuit 18 and the non-rotating section 60 includes the motor assembly 16 and the processor 12.

In the illustrated embodiment, the sensor 10 includes a data transfer module 34 for transferring data from the rotating section 50 to the non-rotating section 60. The data transfer module includes a data transmit module 36 located on the rotating section 50 and a data receive module 38 located on the non-rotating section 60. The data transmit module 36 wirelessly transmits data to the data receive module 38.

As shown, the sensing circuit 18 includes a low pass filter 30A, 30B, 30C, 30D and an analog to digital converter 32A, 32B, 32C, 32D between each amplifier circuit 28A, 28B, 28C, 28D and the data transmit module 36.

In the illustrated embodiment, the sensor 10 further includes a power transfer module 40 for transferring electrical energy from the non-rotating section 60 to the rotating section 50. The power transfer module 40 includes a power transmit module 44 located in the non-rotating section 60 and a power receive section 42 located in the rotating section 50. The power transfer module 40 may be battery powered and is described in more depth below.

As discussed, more fully below, the sensor 10, under control of the processor 12, may rotate the sensor element 14 at first and second rotational rates and measuring the current within each quadrature section 14A, 14B, 14C, 14D while the sensor element 14 is being rotated at each of the first and second rotational rates, respectively.

In another aspect of the present invention, a method for operating the sensor 10 to measure an electric-field is provided. The method includes the steps of rotating the rotating sensor element 14 at a controllable rotation rate, measuring the current induced within each quadrature section 14A, 14B, 14C, 14D by the electric-field and responsively generating first, second, third and fourth current signals, respectively, and receiving the respective current signals at the processor 12 and recovering a waveform representative of the electric field.

In one aspect, the step of receiving the respective current signals at the processor 12 and recovering a waveform representative of the electric field includes the step of combining the first, second, third, and fourth current signals and producing first and second quadrature signals. The waveform is recovered as a function of the first and second quadrature signals.

Industrial Applicability

Figure 2:
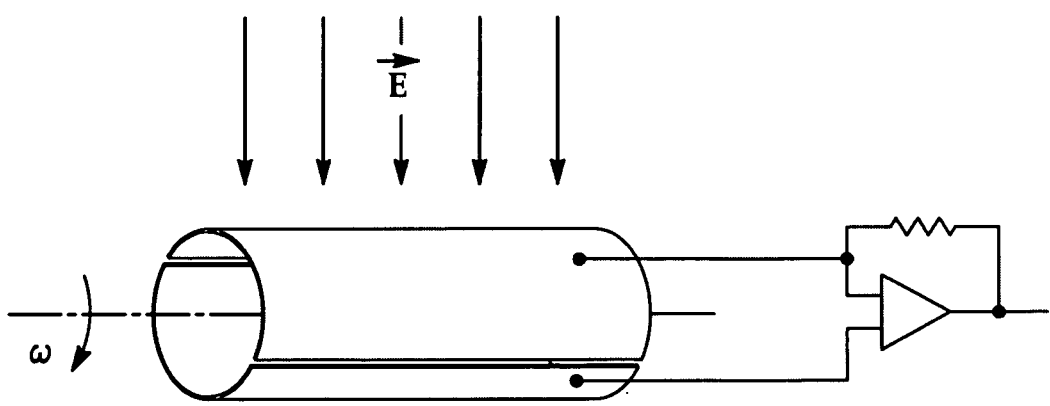
FIG. 2 is a sketch of a cylindrical field mill type sensor.

The prior art cylindrical field mill shown in FIG. 2 produces a current signal described by Equation 2. The current is a sine wave with amplitude dependent on the ambient electric field. The current signal can be described as the product on a non-dimensional sine wave of amplitude one with the ambient electric field. In signal processing, this product is known as mixing or modulation operation. When the electric field is constant or static, the amplitude of the output sinusoidal current signal or waveform varies with the position or the phase of the electrodes. The frequency of the sine waveform is determined by the cylinder's rotation rate, thus measurements of the amplitude of the output current at the rotation rate frequency produce a signal proportional to static external electric fields. The situation is more complex when the electric field also contains transients or AC components. The mixing function given by Equation 2 produces currents with frequencies that are sums and differences of the rotation rate frequency with the frequencies of the AC components of the electric field. This is the well-understood effect of multiplying two sinusoidal functions. Every frequency in the output signal contains the combined effects of two signals of the original electric field of different frequencies. Indeed, the measurement of the static field has the combined signal of the true static (DC) electric field and the AC component with twice the frequency of the rotation rate. For example, if the DC electric field is 100 V/m with an AC field component of amplitude 10 V/m and frequency of 20 Hz, and the cylinder rotates at 10 Hz, the measured value for the DC electric field can vary between 90 and 110 V/m, depending on the phase relationship between the cylinder rotation and the AC field. All frequencies in the demodulated spectrum exhibit this combination of amplitudes referred to as "aliasing". All prior art descriptions of cylindrical field mills with a single pair of sensing plates are subject to this measurement error. Fortunately, in typical applications such as atmospheric field measurements, the electric field energy at AC components of even a few Hz is a small fraction of the DC component, and therefore the error introduced is small. However, this error might cause problems in some industrial and space applications where the DC electric field to be measured is small when compared to AC components.

Figure 4:
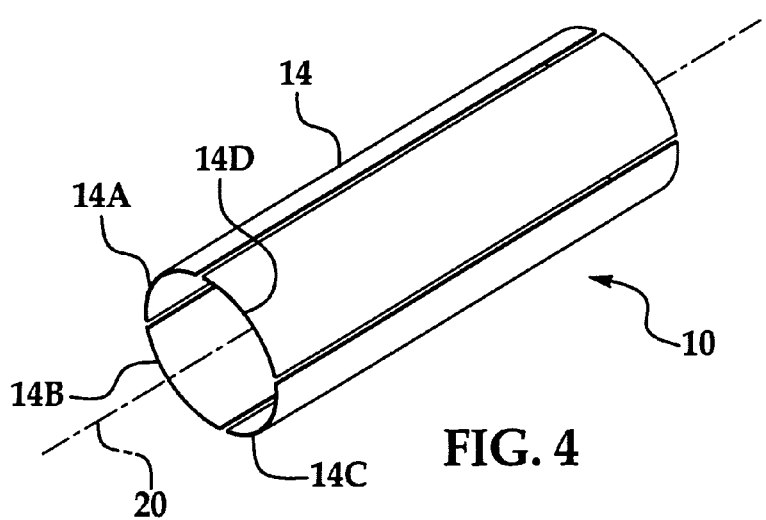
FIG. 4 is a sketch of a sensing surface of the sensing assembly of FIG. 3B divided into four equal sections for quadrature modulation; and, FIG. 5 is block diagram of the sensor of FIG. 4 and control hardware.

The division of the sensing surface into four equal sections as shown in FIG. 4 is a departure from the prior art device depicted in FIG. 2. With the use of four amplifiers, one for each sensor section, the signals can then be recombined in pairs to reproduce the signal that would have been produced by the original device with two sensing surfaces. However, two versions of that signal are created with a 90 degree phase difference per the rotation rate. These two signals "I" and "Q", and are referred to as "quadrature" signals. Given the I and Q signals, aliasing can be eliminated and the external electric field can be reproduced with a proper demodulation technique. This is an important innovation of the new instrument design described below.

Quadrature Demodulation

The I and Q signals contain all the information necessary to recover the external electric field. Indeed, they contain the amplitude information and phase information over the frequency range of interest. True quadrature demodulation, the reverse of the quadrature modulation technique, retains this information. In this technique, the I and Q signals are multiplied by a sinusoidal function with the modulation frequency, in this case the rotation rate. The resulting products are combined in a way that cancels the effects of signal aliasing and reproduce the external electric field waveform including vector and phase information. This processing technique is widely used in communication theory and can be accomplished in a number of ways. One way is with the use of a Fast Fourier Transform, another simply by multiplying the I and Q signals by a sinusoidal function.

Battery and Brush Elimination

The rotating section 50 must receive electrical power to operate. Prior art sensors are described in the literature uses batteries or sliding contacts (brushes) for power. In most designs, the measured signal is also transmitted via sliding contacts. For long term, unattended operation, batteries cannot be used as the sole source of power. Also, brushes or contacts wear out limiting the life of the sensor, and creating noise that reduce the sensitivity of the measurements. A simple implementation can be fully battery powered for short term scientific studies that require the sensor to be isolated from the ground. Alternatively, a rotating transformer can be used to transmit power to the rotating circuitry without the use of brushes. This eliminates the need for batteries. Data can be returned from the rotating circuit via IR (InfraRed) or RF (Radio Frequency) communication paths. In sensors isolated from the ground, power for the motor and data processing unit can be provided by an isolated power system employing fiber optics or photovoltaic cells.

Field Gradient and the Effect of Nearby Surfaces

With careful interpretation of the processed signal, the presence of gradients in the electric field can be measured. Such gradients manifest as signal with amplitude harmonically related to the rotational frequency.

Operation in Corrosive or Fluid Environments, Including Seawater

One embodiment of the sensor 10 can be to fully encapsulate the outer sensing surface with a dielectric cover. The external electric fields penetrate the non-conducting dielectric, producing a signal as in the standard design. The sensor plates 14A, 14B, 14C, 14D are then protected from direct conduction between the plates and consequently signal loss due to contamination or immersion in a conducting fluid such as seawater is eliminated. Charge residing on the surface of the dielectric rotates with the electrodes and therefore does not generate a signal. Such a sensor 10 will be most effective when it is located away from external conducting surfaces, since surface charge could induce a signal via its image on the surface.

As mentioned above, electric field sensors are usually grounded and distort the fields during measurements. Moreover, they are subject to errors due to ion currents. In isolated sensors, ions drift along field lines and impinge on the electrodes until its charge becomes sufficiently large to distort the field lines far enough so that they no longer terminate on it. Although isolated sensors become charged, the charging process is self-limiting and they can measure the local space field. Self-charging by the collection of ions is therefore not a significant error source in isolated sensors, unless they are placed close to a conductor and are affected by the image of their charge on it.

The shape of the local field lines is immaterial when fluxes of charged powders or droplets are present. In this case, considerable amounts of charge might strike the sensor even when it is charged. The potential of grounded sensors remains at zero, but the potential of the isolated sensor may change significantly. In both cases, the current associated with the charge transfer can produce significant errors. The isolated electric field mill that we developed removes the error caused by this charge transfer in two steps: (i) In the first step small, ionizing points are added to the surface of the field mill to effectively limit its potential with respect to the local ambient field. Since the potential of the sensor is limited by the rate at which charge leaks from it, the difference between the potential of the sensing surface and that of the local space can be limited to reasonably small values by corona discharges. However, this does not alter the field mill's charging rate, and the current this charging generates could cause large errors unless another step is taken. (ii) In the second step, the current induced by incoming charges is measured using an idea developed by Smiddy and Chalmers (1958) and Maruvada et al. (1983). They used two grounded double field mills, operating at two different rotation rates, to remove the error caused by wind-borne charges. Instead, we use a single isolated field mill operating sequentially at two different rotation rates. Our approach provides the magnitude and direction of the electric field in a plane perpendicular to the sensing electrodes, even in the presence of wind-borne charges. It can be used either in grounded or isolated versions of the sensor. This second step is discussed in detail below.

The output of cylindrical field mills consists of two components; the first component is caused by charges induced by the electric field to be measured and is proportional to the field mill rotation rate (rotation-dependent component), while the second component is caused by charges impacting on the sensor and is independent of the rotation rate (rotation-independent component). A single measurement cannot distinguish between these two components. However, measurements with a single field mill operating sequentially at two different rotation rates can separate the two components. A sketch of this type of field mill with the relevant parameters is displayed in FIG. 3.

FIG. 3A shows a sketch of the cross section of the field mill in a two-dimensional electric field (E) and a two-dimensional flow of charged particles (I). The output of the device is the current ($i_c$) in the wire connecting electrodes a and b. FIG. 3B shows a sketch of the sensor assembly.

The rotating electric field sensor that we designed can have any shape. However, for simplicity we consider a cylindrical field mill. In this case, the surface charge density (per unit length) induced by the ambient electric field on the cylinder at an azimuthal angle θ is given by $$\sigma(\theta) = 2r\epsilon_0(E_x \sin\theta + i\, E_y \cos\theta) \quad (3)$$

where r is the radius of the sensor, $\epsilon_0$ the permittivity of the atmosphere and $E_x$ and $E_y$ the two components of the ambient electric field in the plane of the sensor. Integrating Eq. (3) over half a cylinder, the total charge on each electrode can be calculated (Misakian et al., 1978) as a function of the electrode orientation angle β.

$$q_a = \int_\beta^{\beta+\pi} \sigma(\theta)\, d\theta \quad (4)$$

Thus, $$q_a = -q_b = 2r\epsilon_0(-E_x \cos\beta + E_y \sin\beta) \quad (5)$$

Taking the angular velocity as constant, so that β=ωt, we get $$q_a(t) = 2r\epsilon_0(-E_x \cos\omega t + E_y \sin\omega t) \quad (6)$$

As the electrodes rotate, the charge remains fixed with respect to the ambient field, so it passes from one electrode to the other. Since i=dq/dt, differentiation with respect to time yields the value of the current in the wire connecting the two electrodes $$i_E(t) = 2r\epsilon_0(E_x \omega \sin\omega t + E_y \omega \cos\omega t) \quad (7)$$

where the subscript E indicates that the current is due to the ambient electric field.

Now, let us analyze the current induced by the impact of charged particles on the sensor. We decompose the particles' velocity into two orthogonal components, as indicated in FIG. 2. Assuming uniform volumetric charge density ρ, and constant particle velocity v, the current per unit area normal to the velocity vector is simply $$i = v\rho \quad (8)$$

Thus, the current between the electrodes of a cylindrical field mill subject to this flux of charged particles is $$i_D(t) = \frac{1}{2}A(I_x \cos\omega t + I_y \sin\omega t) \quad (9)$$

where A is the "effective area" of the cylinder collecting the charged particles, and where the subscript D indicates that this current is due to the impact of charged particles.

The factor ½ appears because wind-driven particles collide only with the upstream half of the sensor, and yet their charge is distributed around the whole cylinder. We refer to A as the "effective area" because the efficiency to which charge is transferred to the cylindrical field mill is not known. The area A is smaller than the area of the cylinder projected into the normal to the flux of charged particles, because the properties of the boundary layer and the efficiency to which dust particles are deflected by it depends on their sizes, properties of the surrounding fluid, and the angular velocity of the field mill (e.g., Reynolds, Knudsen, and Taylor numbers). Nevertheless, an approximation based on a constant A is useful and can be corrected after calibration and tests with a sensor. Assuming that this area is linearly related to the radius r, we get $$i_D(t) = \frac{1}{2}kr(I_x \cos\omega t + I_y \sin\omega t) \quad (10)$$

where k is a constant that depends on the length of the cylinder and the non-dimensional numbers mentioned above.

Assuming superposition, we add the field and dust components of the current and obtain for the total current between the electrodes $$i(t) = 2r\epsilon_0(E_x\omega\sin\omega t + E_y\omega\cos\omega t) + \frac{1}{2}kr(I_x\cos\omega t + I_y\sin\omega t) \quad (11)$$

$$i(t) = r\sin\omega t\left(2\omega\epsilon_0 E_x + \frac{1}{2}kI_y\right) + r\cos\omega t\left(2\omega\epsilon_0 E_y + \frac{1}{2}kI_x\right) \quad (12)$$

$$i(t) = \omega K_1(\sin\omega t E_x + \cos\omega t E_y) + K_2(I_x\cos\omega t + I_y\sin\omega t) \quad (13)$$

where K1=2rε0 and K2=½ kr. Eq (11) shows that the radius of the cylinder affects both components equally, but only the amplitude of the field-induced component depends on the angular velocity, ω. Thus, the components of the current due to the ambient space field and flux of charged particles can be distinguished from each other if the sensor is operated sequentially at two reasonably different angular velocities.

With particular reference to FIG. 4, the sensing surface is divided into 4 equal segments 14A, 14B, 14C, 14D. Each segment 14A, 14B, 14C, 14D is a conductive surface, electrically isolated from the other segments and connected to internal measurement circuitry. The geometry is not limited to this shape or diameter-to-length ratio, but must it must have 90 degree symmetry.

Typical Implementation.

The sensing surface described above, along with the associated sensing circuitry is forced to rotate. One approach shown here is to use a motor 22, which can be a brushed or brushless type DC motor. A "Position Reference" sensor 24 which could be an encoder but may also be as simple as a magnetic or optical detector, producing one pulse per motor rotation, monitors the motor speed. Given the feedback path from the sensor 24 through the processor and Driver, the motor speed can be controlled. In certain applications, the ability to quickly alternate between two rotation rates offers a means to distinguish between the signal generated by ions of charged particle fluxes and that by the ambient electric field.

The sensing circuit 18 consists of four transimpedance amplifiers 28A, 28B, 28C, 28D, each connected to one of the sensing surfaces 14A, 14B, 14C, 14D. The amplifiers 28A, 28B, 28C, 28D present low impedance to the current flowing between the sensing surfaces 14A, 14B, 14C, 14D. Further, the amplifiers 28A, 28B, 28C, 28D reference an internal common node that may be the ground in the case of a grounded sensor, but does not need to be grounded for the sensor to function properly. The range of electric fields that needs to be measured, the physical geometry of the sensing surface 14A, 14B, 14C, 14D, and the sensor rotation rate determine the gain of the transimpedance amplifier. A typical value is 10 MEGOHMS. Following the transimpedance amplifiers 28A, 28B, 28C, 28D or possibly integrated into them are anti-aliasing Low Pass Filters (LPF's) 32A, 32B, 32C, 32D. The cutoff frequency of these filters 32A, 32B, 32C, 32D is the desired upper frequency of the sensor measurement range. The four filtered voltage signals proportional to the four sensor currents in the frequency range of interest are then digitized. The Analog to Digital conversion (A/D) done at this point is performed as early in the signal processing chain as possible.

The digitized data is transmitted from the rotating circuitry to the non-rotating circuit via either optical communication OR for example) or RF link. The digitized data is received into the processor 12 which implements the Quadrature Demodulation process and produces an output appropriate for the application. The full original electric field signal can be reproduced over the frequency range of interest, or it can be compared against a fixed threshold, or a threshold which is a function of the field vector. In its simplest form, exceeding the threshold function can trigger any number of possible output devices, from audible or visible signaling to an optically isolated machine interface (PLC input).

Power may be transmitted to the rotating section 50 using a rotating transformer, or alternately, using photovoltaic cells on the rotating circuit with a fixed light source or ambient light. Power can also be provided by the motion of the fluid medium in which it is immersed, such as via windmill or propeller, therefore, in this case the motor and motor driver can be eliminated and power can be provided by a rotating generator.

Obviously, many modifications and variations of the present invention are possible in light of the above teachings. The invention may be practiced otherwise than as specifically described above.

The invention claimed is:

1. An instrument for measuring electric-field vectors, comprising:
a rotating sensor element composed of four quadrature sections that rotate around a fixed axis;
a motor assembly that spins the sensor element at a controllable rotation rate;
a sensing circuit coupled to the quadrature sections for measuring the currents induced within each quadrature section by the external electric-field and responsively generating respective current signals; and,
a processor coupled to the motor assembly for controlling the rotation rate of the sensor element and to the sensing circuit, receiving the respective current signals, and recovering waveforms representative of the external electric fields.

2. An instrument, as set forth in claim 1, wherein current sensing circuit includes four amplifiers, each amplifier being electrically coupled to one of the quadrature sections for producing respective first, second, third and fourth current signals in response to the measured current in the respective quadrature sections.

3. An instrument, as set forth in claim 2, the processor for combining the first, second, third, and fourth current signals and producing first and second quadrature signals.

4. An instrument, as set forth in claim 3, the processor for demodulating the first and second quadrature signals to recover the waveform representing the electric field.

5. An instrument, as set forth in claim 3, wherein the processor in demodulating the first and second quadrature signals, multiplies the first and second quadrature signals by a sinusoidal function having a modulation frequency.

6. An instrument, as set forth in claim 2, wherein the sensor includes a rotating portion and a non-rotating portion.

7. An instrument, as set forth in claim 6, wherein the rotating section includes sensor element and the current sensing circuit and the non-rotating section includes the motor assembly and the processor.

8. An instrument, as set forth in claim 7, further including a power transfer module for transferring electrical energy from the non-rotating section to the rotating section.

9. An instrument, as set forth in claim 8, wherein the power transfer module includes a power transmit module located in the non-rotating section and a power receive section located in the rotating section.

10. An instrument, as set forth in claim 7, wherein the rotating section is battery powered.

11. A sensor, as set forth in claim 7, further including a data transfer module for transferring data from the rotating section to the non-rotating section.

12. An instrument, as set forth in claim 11, wherein the data transfer module includes a data transmit module located on the rotating section and a data receive module located on the non-rotating section, the data transmit module for wirelessly transmitting data to the data receive module.

13. An instrument, as set forth in claim 12, further comprising an analog to digital converter between each amplifier circuit and the data transmit module.

14. An instrument, as set forth in claim 1, the processor for rotating the sensor element at first and second rotational rates and measuring the current within each quadrature section while the sensor element rotates at each of the first and second rotation rates, respectively.

15. A method for operating an instrument to measure external electric-fields using a rotating sensor element and a processor, the rotating sensor element being composed of four quadrature sections, the sensor element rotating around a fixed axis, the method comprising:
rotating the sensor element at a controllable rate;
measuring the current induced within each quadrature section by the electric-field and responsively generating first, second, third and fourth current signals, respectively; and,
receiving the respective current signals at the processor and recovering a waveform representative of the electric field.

16. A method, as set forth in claim 15, wherein the step receiving the respective current signals at the processor and recovering a waveform representative of the electric field includes the step of combining the first, second, third, and fourth current signals and producing first and second quadrature signals, wherein the waveform is recovered as a function of the first and second quadrature signals.

17. A method, as set forth in claim 16, including the step of demodulating the first and second quadrature signals to recover the waveform representing the electric field.

18. An instrument for measuring electric-field vectors, comprising:

a rotating sensor element having a generally cylindrical shape and being composed of four quadrature sections that rotate about an axis;

a motor assembly coupled to the rotating sensor element, for supporting and rotating the rotating sensor element about the axis at a controllable rotation rate;

a sensing circuit having four amplifiers, each amplifier being electrically coupled to a respective one of the quadrature section for measuring the current induced within the quadrature section by the electric-field and responsively generating respective current signals; and, a processor coupled to the motor assembly for controlling the rotation rate of the sensor element and for receiving the respective current signals, for combining the first, second, third and fourth current signals and responsively generating first and second quadrature signals and recovering a waveform representative of the electric field by demodulating the first and second quadrature signals.

19. An instrument, as set forth in claim 18, wherein the processor in demodulating the first and second quadrature signals, multiplies the first and second quadrature signals by a sinusoidal function having a modulation frequency.

20. An instrument, as set forth in claim 18, wherein the processor in demodulating the first and second quadrature signals, uses an FFT function.

21. An instrument, as set forth in claim 18, wherein the sensor includes a rotating portion and a non-rotating portion, the rotating section including the sensor element and the current sensing circuit and the non-rotating section including the motor assembly and the processor, further including a power transfer module for transferring electrical energy from the non-rotating section to the rotating section and a data transfer module for transferring data from the rotating section to the non-rotating section.

22. An instrument, as set forth in claim 18, wherein the sensor element is covered by dielectric material to allow measurements of electric fields in conducting fluids.

23. An instrument, as set forth in claim 1, wherein the sensor element is covered by dielectric material to allow measurements of electric fields in conducting fluids.

* * * * *